(12) United States Patent
Sun et al.

(10) Patent No.: US 11,342,264 B2
(45) Date of Patent: May 24, 2022

(54) 3D NAND MEMORY DEVICE AND METHOD OF FORMING THE SAME

(71) Applicant: Yangtze Memory Technologies Co., Ltd., Wuhan (CN)

(72) Inventors: Zhongwang Sun, Wuhan (CN); Zhong Zhang, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 52 days.

(21) Appl. No.: 16/853,839

(22) Filed: Apr. 21, 2020

(65) Prior Publication Data

US 2021/0193574 A1 Jun. 24, 2021

Related U.S. Application Data

(63) Continuation of application No. PCT/CN2019/127878, filed on Dec. 24, 2019.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76816* (2013.01); *H01L 21/76877* (2013.01);
(Continued)

(58) Field of Classification Search
CPC ................ H01L 27/11573; H01L 21/76877
See application file for complete search history.

(56) References Cited

U.S. PATENT DOCUMENTS 10,049,744 B2 8/2018 Jeong et al.
10,211,150 B2 2/2019 Chen
(Continued)

FOREIGN PATENT DOCUMENTS

CN 104835824 A 8/2015
CN 106992181 A 7/2017
(Continued)

OTHER PUBLICATIONS

Chinese Office Action dated Aug. 17, 2021 in Chinese Patent Application No. 201980003923.3, 9 pages.
(Continued)

*Primary Examiner* — Farun Lu
(74) *Attorney, Agent, or Firm* — Oblon, McClelland, Maier & Neustadt, L.L.P.

(57) ABSTRACT

A semiconductor device is provided. The semiconductor device includes a substrate, a stack of word line layers and insulating layers that are stacked alternatingly over the substrate, and channel structures formed in a first array region and a second array region of the stack. The first array region and the second array region are positioned at opposing sides of the stack. A first staircase is formed in a connection region of the stack over the substrate, where the connection region is arranged between the first and second array regions. A second staircase is formed in the connection region of the stack over the substrate, and the connection region in the stack includes a separation region between the first and second staircases.

10 Claims, 11 Drawing Sheets

(51) Int. Cl.

| | | |
|---|---|---|
| *H01L 23/522* | (2006.01) | |
| *H01L 23/535* | (2006.01) | |
| *H01L 27/11519* | (2017.01) | |
| *H01L 27/11556* | (2017.01) | |
| *H01L 27/11565* | (2017.01) | |
| *H01L 27/11582* | (2017.01) | |
| *H01L 27/11575* | (2017.01) | |
| *H01L 27/11573* | (2017.01) | |

(52) U.S. Cl.
CPC .... *H01L 21/76895* (2013.01); *H01L 23/5226* (2013.01); *H01L 23/535* (2013.01); *H01L 27/11519* (2013.01); *H01L 27/11556* (2013.01); *H01L 27/11565* (2013.01); *H01L 27/11573* (2013.01); *H01L 27/11575* (2013.01); *H01L 27/11582* (2013.01)

(56) References Cited

U.S. PATENT DOCUMENTS

| | | | |
|---|---|---|---|
| 10,211,154 B2 | 2/2019 | Lee et al. | |
| 10,224,341 B2 | 3/2019 | Kim et al. | |
| 10,446,437 B2 | 10/2019 | Yang | |
| 2016/0079185 A1* | 3/2016 | Kato | H01L 23/5226 |
| | | | 257/314 |
| 2017/0040254 A1 | 2/2017 | Hwang et al. | |
| 2017/0179028 A1 | 6/2017 | Lee et al. | |
| 2017/0200676 A1 | 7/2017 | Jeong et al. | |
| 2017/0069567 A1 | 9/2017 | Chen | |
| 2017/0256551 A1* | 9/2017 | Lee | H01L 27/11582 |
| 2018/0102281 A1 | 4/2018 | Yang | |
| 2018/0182775 A1 | 6/2018 | Kim et al. | |
| 2019/0148295 A1 | 5/2019 | Lee et al. | |
| 2019/0157297 A1 | 5/2019 | Kim et al. | |
| 2019/0237477 A1 | 8/2019 | Bake et al. | |

FOREIGN PATENT DOCUMENTS

| | | |
|---|---|---|
| CN | 107768446 A | 3/2018 |
| CN | 107919361 A | 4/2018 |
| CN | 108231785 A | 6/2018 |
| CN | 109754836 A | 5/2019 |
| CN | 109887927 A | 6/2019 |
| CN | 109997225 A | 7/2019 |
| CN | 110112136 A | 8/2019 |
| CN | 110137178 A | 8/2019 |
| CN | 110277394 A | 9/2019 |
| CN | 110277397 A | 9/2019 |
| TW | 201814839 A | 4/2018 |

OTHER PUBLICATIONS

International Search Report dated Sep. 29, 2020 in PCT/CN2019/127878, 4 pages.
Office Action dated Apr. 15, 2021 in corresponding Chinese Patent Application No. 201980003923.3, 7 pages.
Office Action dated Jan. 11, 2022 in Chinese Patent Application No. 201980003923.3.

* cited by examiner

3D NAND MEMORY DEVICE AND METHOD OF FORMING THE SAME

RELATED APPLICATION

This application is a bypass continuation of International Application No. PCT/CN2019/127878, filed on Dec. 24, 2019. The entire disclosure of the prior application is hereby incorporated by reference in its entirety.

BACKGROUND

Flash memory devices have recently been undergoing rapid development. Flash memory devices are able to retain stored data for a long period of time without applying a voltage. Further, the reading rate of flash memory devices can be relatively high, and it is easy to erase stored data and rewrite data into the flash memory devices. Thus, flash memory devices have been widely used in micro-computers, automatic control systems, etc. To increase the bit density and reduce the bit cost of flash memory devices, three-dimensional (3D) NAND (Not AND) flash memory devices are being developed.

SUMMARY

According to an aspect of the disclosure there is provided a semiconductor device. The semiconductor device can include a substrate, a stack of word line layers and insulating layers that are stacked alternatingly over the substrate, and channel structures formed in a first array region and a second array region of the stack. The first and second array regions are positioned at opposing sides of the stack. A first staircase is formed in a connection region of the stack over the substrate. The connection region is arranged between the first and second array regions. A second staircase is formed in the connection region of the stack over the substrate, and the connection region in the stack includes a separation region between the first and second staircases.

In some embodiments, the first staircase can have a first group of stairs (or first stairs) with a first step-down direction, and a second group of stairs (or second stairs) with a second step-down direction. The first step-down direction is opposite to the second step-down direction, and the first group of stairs and the second group of stairs converge at a first shared stair. In addition, the second staircase can have a third group of stairs (also referred to as third stairs) with the first step-down direction, and a fourth group of stairs (also referred to as fourth stairs) with the second step-down direction so that the third group of stairs and the fourth group of stairs converge at a second shared stair.

In some embodiments, the first group of stairs and the second group of stairs in the first staircase can have a third step-down direction that is perpendicular to the first and second step-down directions. The third and fourth groups of stairs in the second staircase can have a fourth step-down direction that is perpendicular to the first and second step-down direction. The fourth step-down direction can be opposite to the third step-down direction.

In some embodiments, the separation region in the semiconductor device includes a first portion and a second portion that are positioned at opposing ends of the separation region, and a third portion that is positioned between the first and second portions. The first staircase is arranged between the first and second portions and extends along the third portion. The second staircase is arranged between the first and second portions and extends along the third portion. The first and second staircases are spaced apart from one another by the third portion.

In some embodiments, each stair in the first staircase can have a smaller height than a height of a stair in the second staircase on an opposite side of the separation region. In addition, the first and second portions of the separation region can be of a same width, and the third portion can have a smaller width than the first and second portions. Further, an uppermost stair in the second staircase and the separation region can have a same height.

In some embodiments, the semiconductor device can also include first contact structures that are formed on the first staircase and connected to the word line layers in the first staircase. The semiconductor device can have second contact structures formed on the second staircase and connected to the word line layers in the second staircase.

According to another aspect of the disclosure, a method for fabricating a semiconductor device is provided. An initial stack of sacrificial word line layers and insulating layers is formed over a substrate of the semiconductor device. The sacrificial word line layers and the insulating layers are disposed over the substrate alternately. A first staircase is formed in a first staircase region of a connection region of the initial stack. A second staircase is formed in a second staircase region of the connection region of the initial stack. The connection region of the initial stack includes a separation region between the first and second stair cases, and the connection region is positioned between array regions of the initial stack at opposing sides of the initial stack.

In some embodiments, in order to form the first staircase, one or more of the sacrificial word line layers and the insulating layers can be removed in the first staircase region of the connection region. Further, at least one of the sacrificial word line layers and the insulating layers in the first staircase region can be shaped to form a first stair with a first step-down direction. The first stair divides the first staircase region into a first section and a second section. At least one of the sacrificial word line layers and the insulating layers can be subsequently shaped in the first staircase region to form stairs with a second step-down direction. A resist trim process and an etching process can be performed sequentially on the sacrificial word line layers and the insulating layers in the first staircase region to form the first staircase in the first staircase region.

In some embodiments, in order to form the first staircase, at least one of the sacrificial word line layers and the insulating layers can be shaped in the second staircase region of the connection region to form a second stair with the first step-down direction. The second stair divides the second staircase region into a third section and a fourth section. At least one of the sacrificial word line layers and the insulating layers can be shaped in the second staircase region to form stairs with a third step-down direction that is opposite to the second step-down direction. Subsequently, a resist trim process and an etching process can be performed sequentially on the sacrificial word line layers and the insulating layers in the second staircase region to form the second staircase in the second staircase region.

The first staircase can include first stairs with a fourth step-down direction in the first section, and second stairs with the first step-down direction in the second section. The first stairs and the second stairs can converge at a first shared stair, and the fourth step-down direction is opposite to the first step-down direction. The second staircase can have third stairs with the fourth step-down direction in the third section, and fourth stairs with the first step-down direction in the fourth section. The third stairs and the fourth stairs can converge at a second shared stair.

In some embodiments, the first stairs and the second stairs can further have the second step-down direction. The third stairs and the fourth stairs can further have the third step-down direction. The second step-down direction is opposite to the third step-down direction.

In some embodiments, the separation region further includes a first portion and a second portion that are positioned at ends of the separation region, and a third portion that is positioned between the first and second portion. The first staircase can be arranged between the first portion and the second portion and extend along the third portion. The second staircase can be arranged between the first and second portion and extend along the third portion. The first staircase and the second staircase can be spaced apart from one another by the third portion.

In some embodiments, each stair in the first staircase can have a smaller height than a height of a stair in the second staircase on an opposite side of the separation region.

In the disclosed method, channel structures can be subsequently formed in the array regions of the initial stack, where the channel structures extend from the substrate and extend through the sacrificial word line layers and the insulating layers in the array regions of the initial stack. The sacrificial word line layers can then be replaced with word line layers that are made of a conductive material. Further, first contact structures on the first staircase, and second contact structures on the second can be formed. The first contact structures are connected to the word line layers in the first staircase, and the second contact structures are connected to the word line layers in the second staircase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
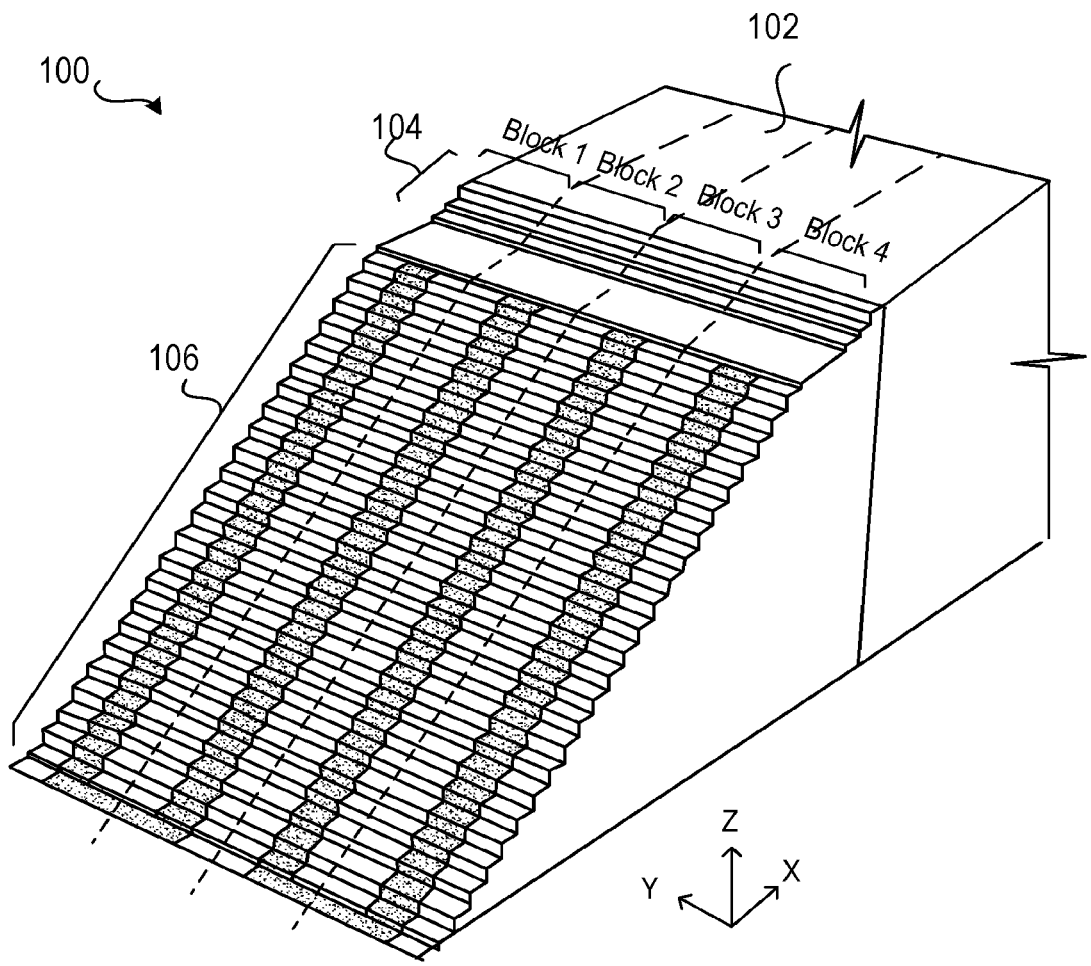
FIG. 1 is a three-dimensional view of a 3D NAND device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D NAND device can include an array region and one or more connection regions positioned at boundaries of the array region. The array region can include a plurality of channel structures that extend through a plurality of word line layers stacked over a substrate of the device. The word line layers can further laterally extend to the connection region with a stair-cased/step-shaped configuration. A plurality of contact structures can be connected to the word line layers in the connection region and further coupled to external control signals.

The present disclosure includes embodiments directed to staircase configurations in a 3D NAND device. A staircase configuration can include a stair-cased connection region that is arranged between two array regions of the 3D NAND device, where the two array regions are formed at two opposing sides of the 3D NAND device. The staircase configuration can not only enhance word line controls but also simplify a manufacturing process and reduce or minimize mask layers by combining a chop process and a stair divided scheme during the manufacturing process.

FIG. 1 is a three-dimensional view of a 3D NAND device 100. As shown in FIG. 1, the device 100 can include a stack of word line layers and insulating layers that are arranged alternately over a substrate (not shown). The stack can have an array region 102, where a plurality of channel structures (not shown) can extend from the substrate and extend through the word line layers and insulating layers in the array region. The stack can also have a connection region that is formed with a stair-cased configuration and positioned at a side of the array region 102. The connection region can have a first stair-cased portion 104 that is connected to one or more bottom select gates of the device 100. The connection region can also have a second stair-cased portion 106 that is connected to the channel structures in the array region 102 to form an array of memory cells. In an exemplary embodiment of FIG. 1, the device 100 can have four blocks, where each of the four blocks can have one or more sub-blocks (also referred to as fingers, or finger structures).

Figure 2:
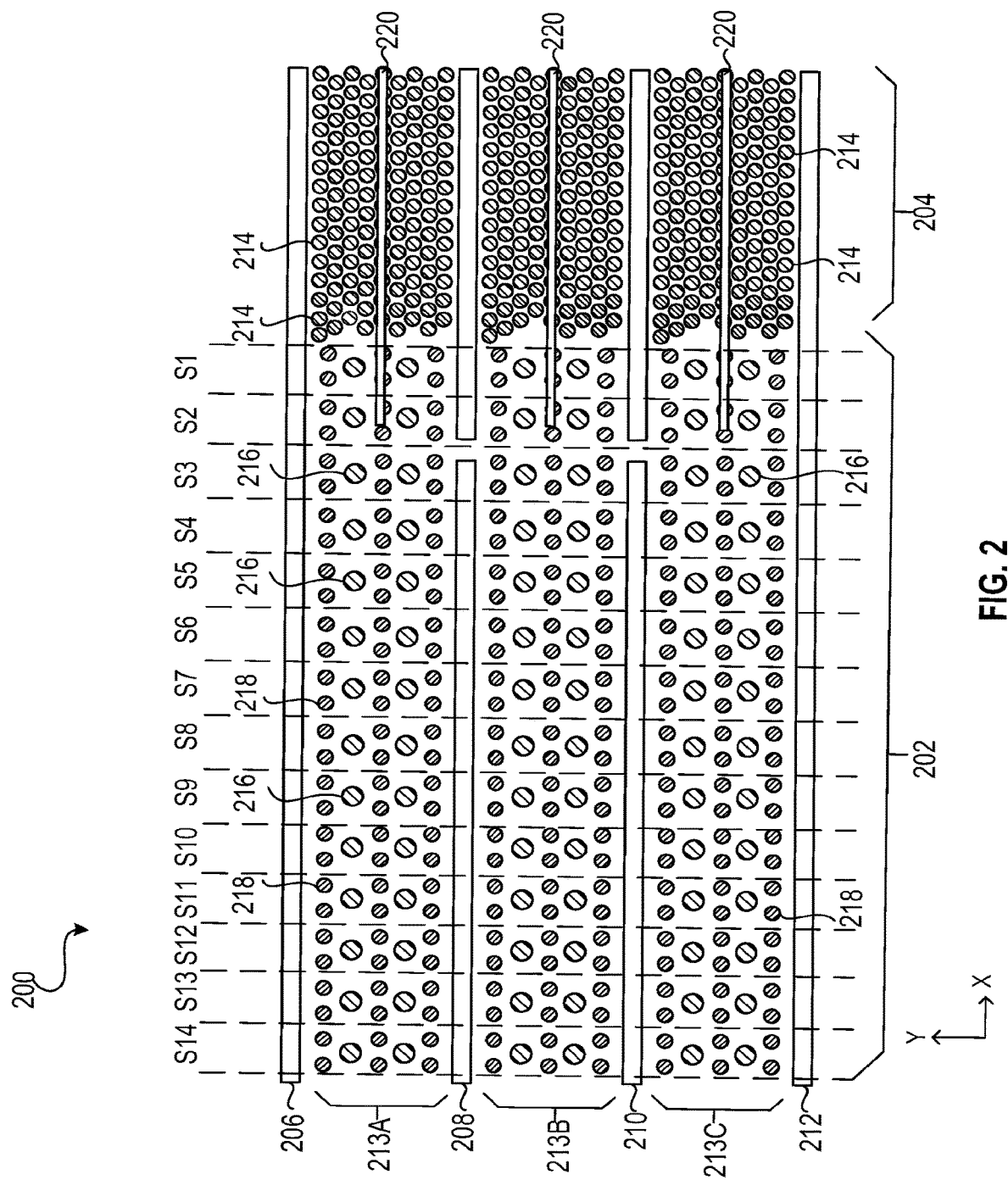
FIG. 2 is a top down view of the 3D NAND device illustrated in FIG. 1.

FIG. 2 is a top down view of a block 200 in the 3D NAND device 100. The block 200 can have a connection region (also referred to as staircase region) 202 and an array region 204. The connection region is positioned at a first side of the array region 204. In some embodiments, another connection region (not shown) can be positioned at a second side of the array region 204. For example, the second side is opposite to the first side. The block 200 can have slit structures (also referred to gate line slits) 206, 208, 210, 212 that divide the block 200 into three sub-blocks (or finger structures) 213A-213C. The slit structures (e.g., 206 and 212) can be positioned at top and bottom boundaries of the block and have a continuous shape. The slit structures (e.g., 208, 210) can be disposed within the block 200 and have a discontinuous shape. In some embodiments, a gate-last fabrication technology is used to form the 3D NAND device 100, thus the slit structures are formed to assist the removal of sacrificial word line layers, and the formation of the real gates. In some embodiments, the slit structures can be made of conductive materials and positioned on array common source (ACS) regions to serve as contacts, where the ACS regions are formed in the substrate to serve as common sources. In some embodiments, the slit structures can be made of dielectric materials to serve as separation structures.

The connection region 202 can have a plurality of stairs. For example, 14 stairs S1-S14 are included in the connection region 202 of FIG. 2 with a step-down direction along the −X direction. The connection region 202 can have a plurality of dummy channel structures 218. The dummy channel structures 218 can be disposed at suitable places for process variation control during fabrication and/or for additional mechanical support. The connection region 202 can also have a plurality contact structures 216 that are positioned on the stairs S1-S14 and connected to the word line layers. The contact structures 216 can extend from the stairs S1-S14 and further be connected to metal layers (e.g., M0 layer, M1 layer) of the backend of line (BEOL), where the metal layers are stacked over the contact structures 216.

In the array region 204, a plurality of channel structures 214 are disposed. The channel structures 214 can extend from the substrate and extend through the word line layers so as to form an array of vertical memory cell strings. Each of the vertical memory cell string can include a respective channel structure that is coupled to the word line layers to form one or more bottom select transistors (BSTs), a plurality of memory cells (MCs), and one or more top select transistors (TSTs) that are disposed sequentially and in series over the substrate. Each of the channel structures can further include a channel layer, a tunneling layer that surrounds the channel layer, a charge trapping layer that surrounds the tunneling layer, and a barrier layer that surrounds the charge trapping layer and further is in direct contact to the word line layers. In some embodiments, a high-K layer, such as $HfO_2$ or AlO, can be disposed between the word line layers and the barrier layer.

In some embodiments, one or more trenches 220, for example serving as top select gate cut (TSG-Cut) structures can be disposed in the array region 204. As shown in FIG. 2, the TSG-Cut structures 220 can be disposed in the middle of each of the finger (or sub-block) portions 213A-213C to divide a top select gate (TSG) layer of the corresponding memory finger into two portions, and thereby can divide the corresponding memory finger portion into two separately programmable (read/write) pages. While an erase operation of a 3D NAND device can be carried out at a memory block level, read and write operations can be carried out at a memory page level.

In the 3D NAND device 100, the connection region 202 can be formed by performing a resist trim process and an etching process sequentially on the word line layers and the insulating layers. As shown in FIG. 2, the connection region 202 is formed along one step-down direction (e.g., −X direction) with three or more stair divided schemes (or divided stair regions). As the 3D NAND technology migrates towards higher density and higher capacity, for example from a 64 layer (64L) to 128L architecture, forming the stair-cased configuration of the 3D NAND device 100 becomes a more time-consuming process. In addition, the word line layers positioned at the bottom portion of the stack can have a long dimension along the step-down direction (e.g., −X direction) as the 3D NAND technology migrates to the 128L architecture, which can result in a high resistance-capacitance (RC) delay.

In the present disclosure, staircase configurations in a 3D NAND device are provided. A connection region can be arranged between array regions (e.g., two array regions) of the 3D NAND device. The array regions are formed, for example, at two opposing sides of the 3D NAND device. One or more staircases can be formed in the connection region. Each staircase can have stairs in two or more step-down directions. The staircase configuration can not only enhance word line controls but also simplify a manufacturing process and minimize a mask request by combining a chop process and a stair divided scheme during the manufacturing process.

Figure 3:
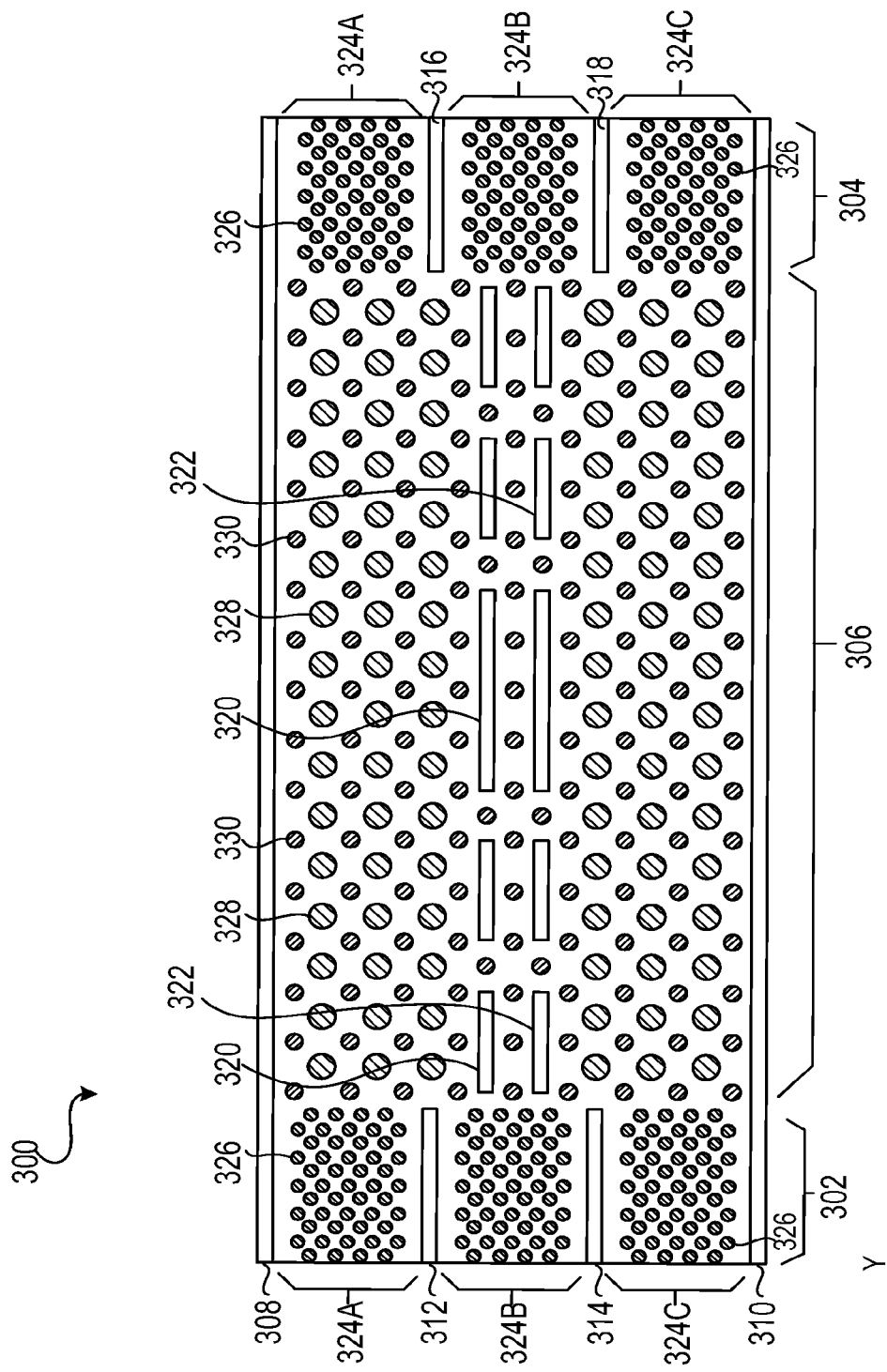
FIG. 3 is a top down view of an exemplary 3D NAND device, in accordance with exemplary embodiments of the disclosure.

FIG. 3 is a top down view of an exemplary 3D NAND device. For simplicity and clarity, FIG. 3 illustrates only one block 300 of the 3D NAND device. However, the 3D NAND device can include any number of blocks, for example, according to the circuit design. As shown in FIG. 3, the block 300 can have a stack that is formed of alternatingly disposed word line layers and insulating layers over a substrate (not shown). The block 300 can have array regions (e.g., two array regions 302 and 304) and a connection region 306. The two array regions 302 and 304 are positioned at two opposing sides of the block 300. The connection region 306 can be disposed between the two array regions 302 and 304. The block 300 can also have a plurality of slit structures (or gate line slits) 308, 310, 312, 314, 316, 318, 320, and 322. The slit structures 308 and 310 are positioned at the top and bottom boundaries of the block 300 respectively. The slit structures 312 and 314 are disposed within the array region 302, and the slit structures 316 and 318 are disposed within the array region 304. Accordingly, the array regions 302 and 304 are divided into three sub-blocks (or fingers) 324A-324C by the slit structures 312, 314, 316 and 318. The slit structures 320 and 322 are positioned in the connection region 306 and can have a discontinuous configuration. In some embodiments, the slit structures 320 and 322 can be dummy slit structures, that is the slit structures 320 and 322 are not connected to any electrical inputs. In some embodiments, the slit structures (e.g., 320 and 322) in the connection region are not aligned with, or offset from, one or more of the slit structures (e.g., 312, 314, 316, and 318) in the array regions.

Still in FIG. 3, similar to the block 200, the array regions 302 and 304 of the block 300 can have a plurality of channel structures 326. The channel structures 326 can extend from the substrate and extend through the word line layers and the insulating layers in the array regions. The connection region 306 can have a plurality of contact structures 328 and a plurality of dummy channel structures 330. The contact structures 328 and dummy channel structures 330 are positioned on the word line layers and further extend from the word line layers in the connection region (e.g., along a direction perpendicular to the substrate). For example, each of the plurality of contact structures can be positioned on a different word line layer.

Figure 4A:
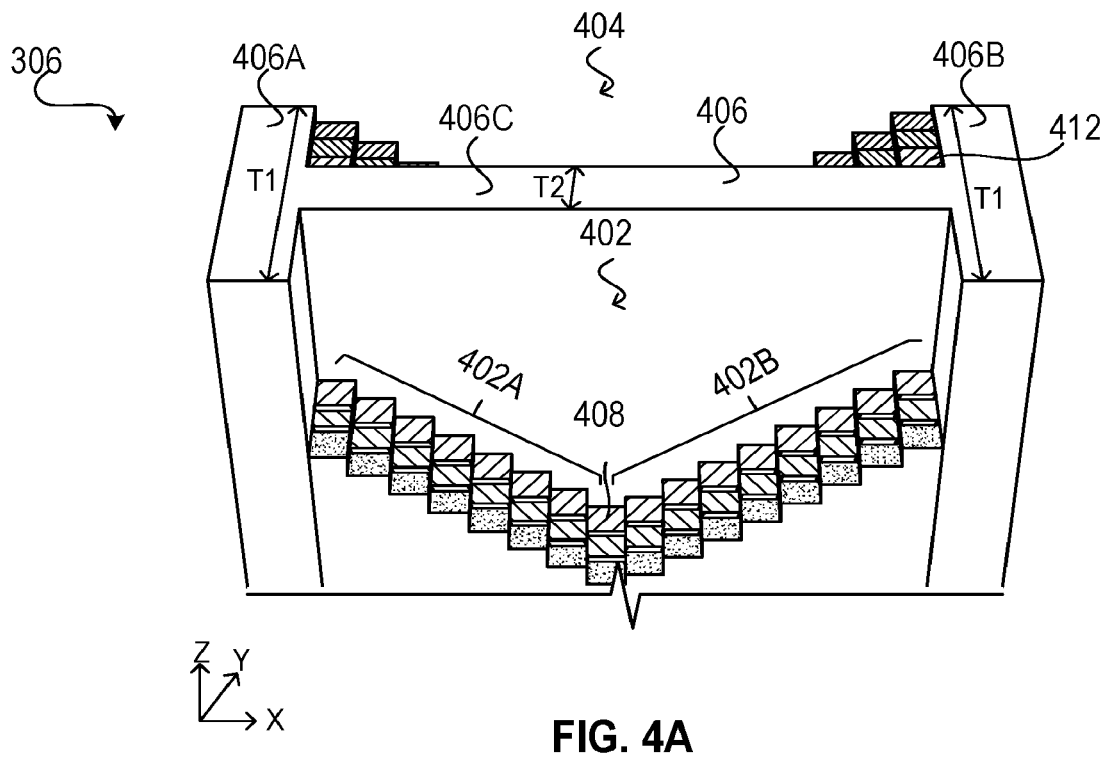
FIGS. 4A and 4B are three-dimensional views of a connection region in an exemplary 3D NAND device, in accordance with exemplary embodiments of the disclosure.
Figure 4B:
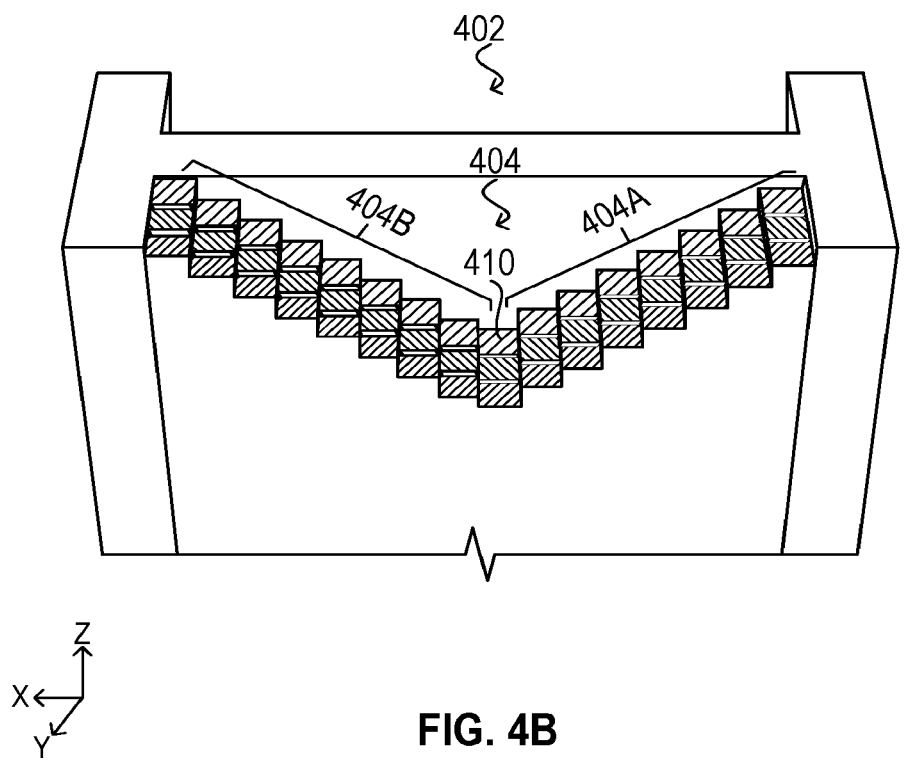

FIGS. 4A and 4B are three-dimensional views of an embodiment of the connection region 306 in the block 300. FIG. 4A is obtained from a front side of the connection region, and FIG. 4B is obtained from a backside of the connection region. As shown in FIGS. 4A and 4B, the connection region 306 can have a first staircase 402 and a second staircase 404. In some embodiments, the connection region 306 includes a separation region 406 that is disposed between the first and second staircases 402 and 404.

The first staircase 402 can have a first group of stairs 402A and a second group of stairs 402B. The first and second groups of stairs 402A and 402B may have the same number or different number of stairs, for example based on the number of word line layers in the stack. In an exemplary embodiment of FIG. 4A, the first group of stairs 402A can have eight steps along a first step-down direction (e.g., X direction), and the second group of stairs 402B can have a nine steps along a second step-down direction (e.g., -X direction). The first step-down direction is opposite to the second step-down direction so that the first group of stairs 402A and the second group of stairs 402B can converge at one or more shared stairs (e.g., stair 408). The first and second groups of stairs 402A and 402B can further have one or more steps along a third step-down direction (e.g., -Y direction) that is perpendicular to the first and second step-down directions. For example, as shown in FIG. 4A, each of the first and second groups of stairs can have three steps along the -Y direction. Accordingly, the first staircase can have three stair divided schemes (or three divided stair regions) along the third step-down direction.

Similarly, the second staircase 404 can have a third group of stairs 404A and a fourth group of stairs 404B. The third and fourth groups of stairs 404A and 404B may have the same number or different number of stairs, for example based on the number of word line layers in the stack. The third group of stairs 404A can have eight steps along the first step-down direction (e.g., X direction), and the fourth group of stairs 404B can have a nine steps along the second step-down direction (e.g., -X direction). The third group of stairs 404A and the fourth group of stairs 404B can converge at one or more shared stairs (e.g., stair 410). The third and fourth groups of stairs 404A and 404B can have one or more steps along a fourth step-down direction (e.g., Y direction) that is perpendicular to the first and second step-down directions. The fourth step-down direction is further opposite to the third step-down direction. In an exemplary embodiment of FIG. 4B, each of the third and fourth groups of stairs can have three steps along the Y direction. Accordingly, the second staircase can have three stair divided schemes (or three divided stair regions) along the fourth step-down direction.

It should be noted that FIGS. 4A and 4B are merely examples, and the first and second staircases 402 and 404 can have any number of groups of stairs. In addition, each of the groups of stairs can have any number of stairs and any number of stair divided schemes according to the device structure.

Still referring to FIGS. 4A and 4B, the separation region 406 can further include a first portion 406A and a second portion 406B that are positioned at two opposing ends of the separation region 406, and a third portion 406C that is positioned between the first and second portions. Accordingly, the first staircase 402 can be arranged between the first and second portions 406A and 406B and extend along the third portion 406C. The second staircase can be arranged between the first and second portions 406A and 406B and extend along the third portion 406C. The first and second staircases 402 and 404 are further separated, or spaced apart, from one another by the third portion 406C.

In some embodiments, the first and second portions 406A and 406B of the separation region 406 are of a same width T1, and the third portion 406C has a smaller width T2 than the first and second portions 406A and 406B. In some embodiments, an uppermost stair 412 in the second staircase 404 and the separation region 406 are of a same height.

Figure 5:
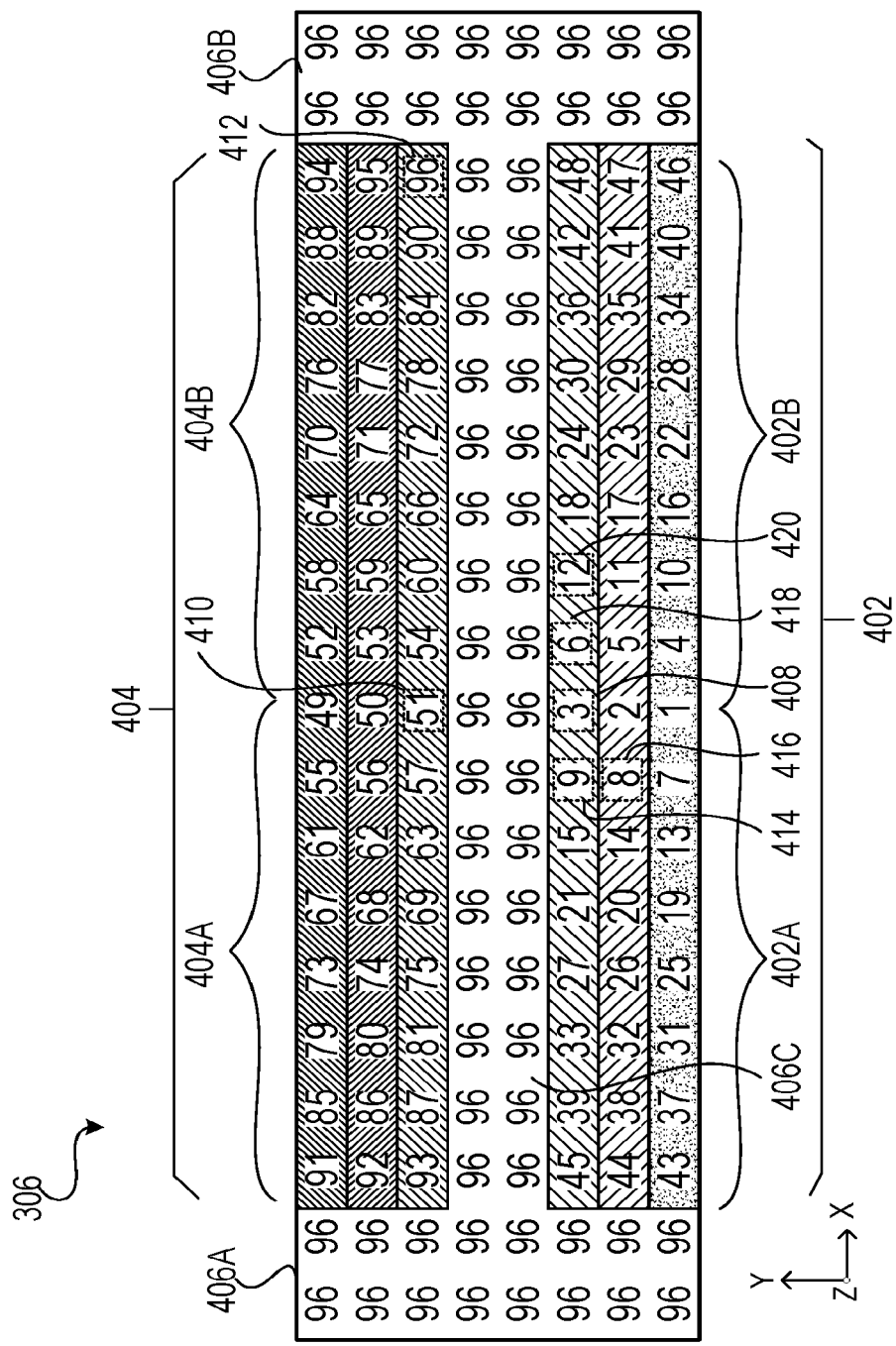
FIG. 5 is a schematic top down view of a connection region in an exemplary 3D NAND device, in accordance with exemplary embodiments of the disclosure.

FIG. 5 is schematic top down view of an embodiment of the connection region 306 in the block 300. In an exemplary embodiment of FIG. 5, the block 300 can include a stack with 96 pairs of word line layers and insulating layers. A top word line layer of the stack is labelled as 96 and a bottom word line layer of the stack is labelled as 1. As shown in FIG. 5, each stair can have a numeric label that refers to a height of the stair, or a number of word line layers that the stair includes. The numeric label also refers to an exposed layer (or uppermost layer) of the word line layers in each stair. By introducing the first staircase 402, and the second staircase 404, each of the word line layers in the block 300 can be exposed to receive a corresponding contact structure (e.g., contact structures 328 in FIG. 3).

For example, the stair 408 has a numeric label 3, which means that the stair 408 includes three word line layers (or has a height of three word line layers), and a top layer that is exposed is a third word line layer in the stack. In some embodiments, each stair in the first staircase 402 can have a smaller height than a height of a stair in the second staircase 404 that is disposed on an opposite side of the separation region (e.g., the separation region 406C). For example, the stair 408 in the first staircase 402 has a smaller height (e.g., 3) than a height (e.g., 51) of the stair 410 in the second staircase 404, and the stair 408 and stair 410 are disposed on two opposing sides of the separation region. In addition, the uppermost stair 412 in the second staircase 404 and the separation region 406 can be of a same height (e.g., 96).

A height difference between two adjacent stairs can be described based on the first staircase 402. The second staircase 404 has a similar configuration to the first staircase 402. According to FIG. 5, the first staircase 402 can have three stairs along the third step down direction (e.g., -Y direction), and a height difference between two adjacent stairs (e.g., stair 414 and stair 416) of the three stairs is one, that is equal to a height of one word line layer. The first group of stairs 402A can have eight stairs and a height difference between two adjacent stairs (e.g., the stair 408 and the stair 414) of the eight stairs is six, that is equal to a height of six word line layers. The second group of stairs 402B can have nine stairs and a height difference between two adjacent stairs of the nine stairs can be six or three, depending on locations of the stairs. For example, the stair 408 and stair 418 have a height difference of three, and the stair 418 and stair 420 have a height difference of six. The first group of stairs 402A and the second group of stairs 402B can converge at one or more shared stairs (e.g., the stair 408).

Figure 6A:
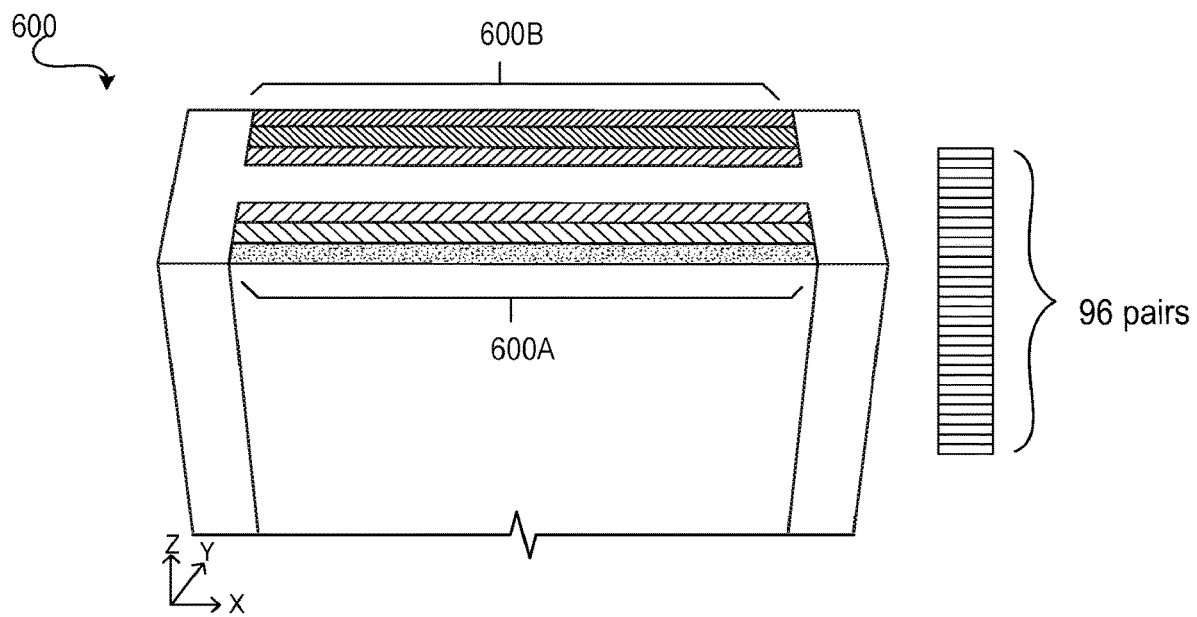
FIGS. 6A, 6B, 7A, 7B, 8A, 8B, 9A, 9B, 10A, and 10B are three-dimensional views of various intermediate steps of manufacturing an exemplary 3D NAND device, in accordance with exemplary embodiments of the disclosure.
Figure 6B:
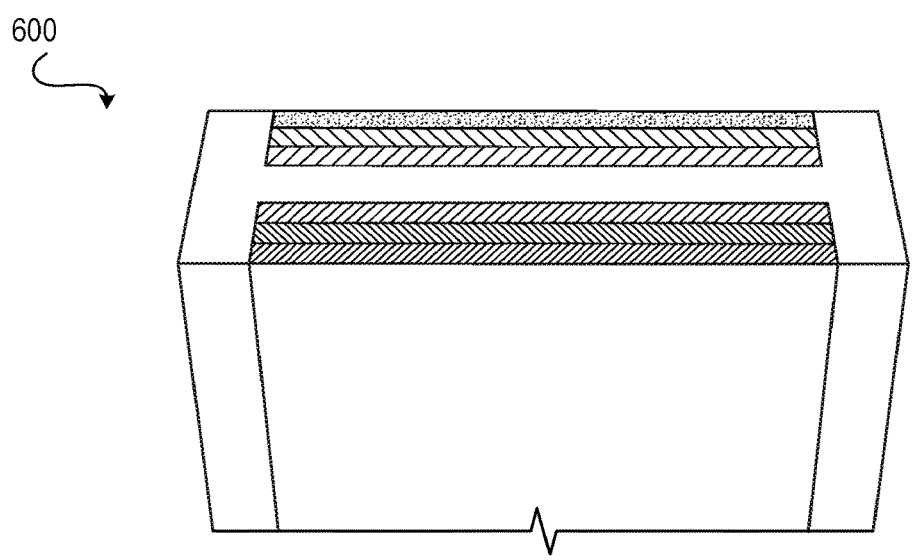

FIGS. 6A, 6B, 7A, 7B, 8A, 8B, 9A, 9B, 10A, and 10B are three-dimensional views of various intermediate steps of manufacturing an exemplary 3D NAND device. In FIGS. 6A and 6B, a stack 600 of word line layers and insulating layers are provided. In an exemplary embodiment of FIGS. 6A and 6B, 96 pairs of word line layers and insulating layers are stacked alternatingly in a substrate. FIG. 6A is obtained from a front side of the stack 600, and FIG. 6B is obtained from a backside of the stack 600. The word line layers and the insulating layers are disposed alternatingly over a substrate (not shown). In some embodiments, the word line layers formed in the stack 600 can be sacrificial word line layers, and the sacrificial word line layers can be replaced with a conductive material to form word line layers in subsequent manufacturing steps. In some embodiments, the sacrificial word line layers can be made of SiN, and the insulating layers can be made of SiO. Any suitable deposition process can be applied to form the sacrificial word line layers and the insulating layers. For example, a chemical vapor deposition process, a physical vapor deposition process, a diffusion process, an atomic layer deposition process, or other suitable deposition processes can be applied.

Figure 7A:
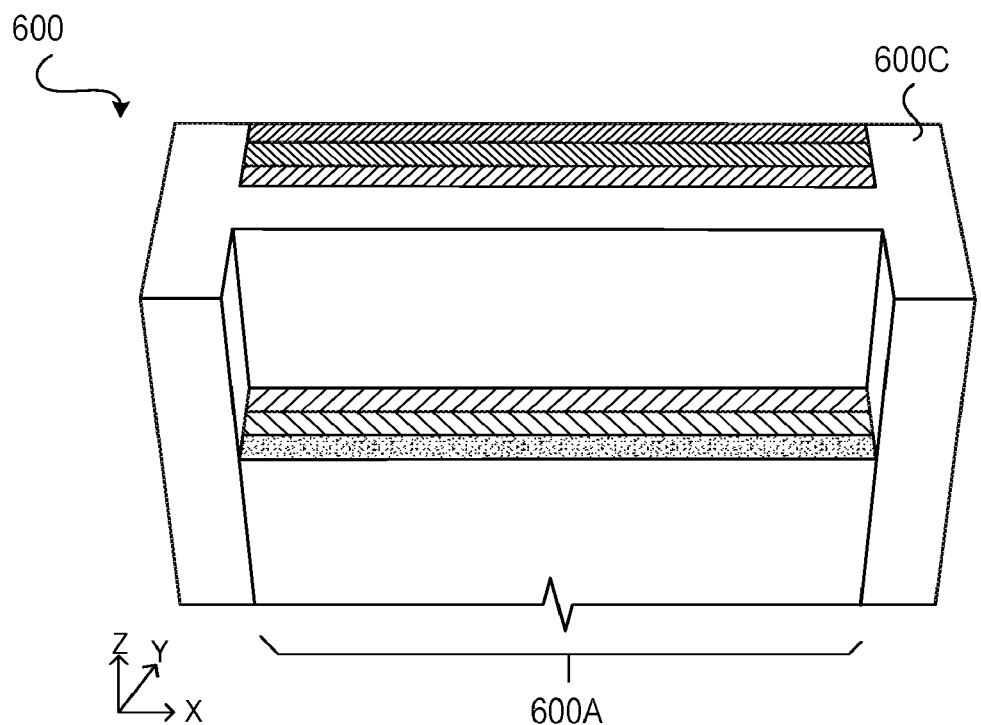
Figure 7B:
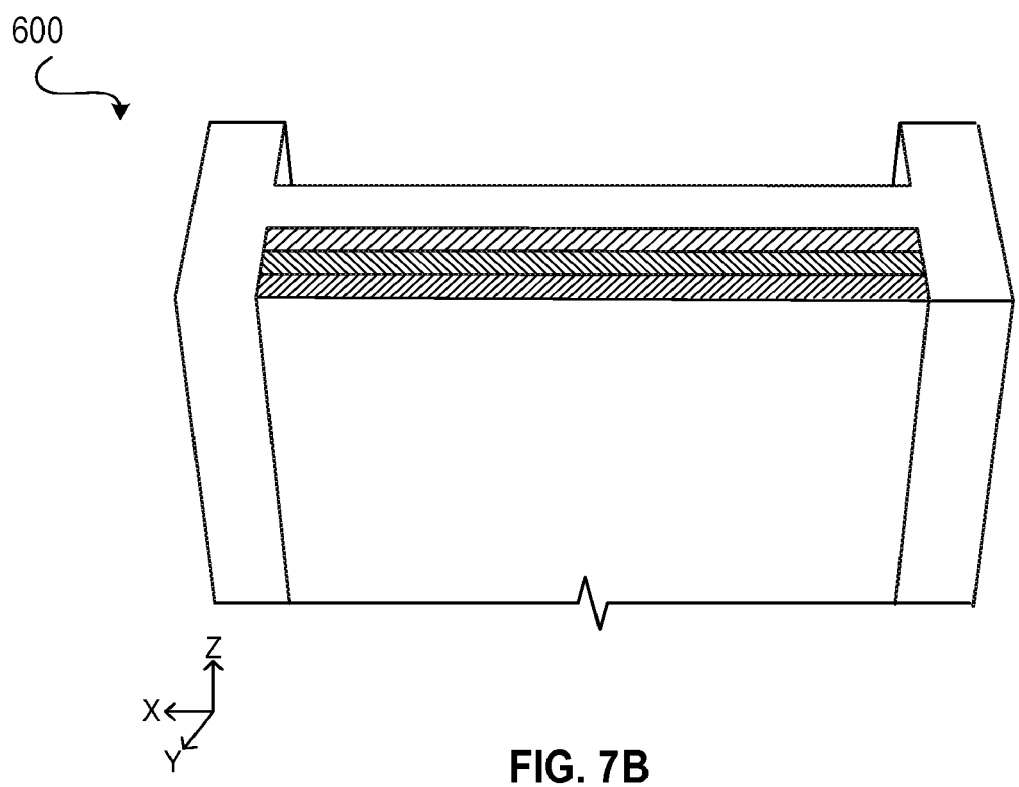

In FIGS. 7A and 7B, portions of the sacrificial word line layers and the insulating layers can be removed along a vertical direction (e.g., −Z direction) to define a first staircase region 600A in the stack 600. The vertical direction is perpendicular to the substrate. In order to remove the portions of the sacrificial word line layers and the insulating layers in the stack 600, a combination of a photolithography process and an etching process can be applied. The photolithography process can apply a mask layer over a top surface 600C of the stack 600 to expose the first staircase region 600A and cover a remaining region of the stack. The etching process can be applied subsequently to remove the portions of the sacrificial word line layers and insulating layers in the first staircase region 600A. In an exemplary embodiment of FIGS. 7A and 7B, half of the word line layers in the first staircase region 600A are removed along the vertical direction.

Figure 8A:
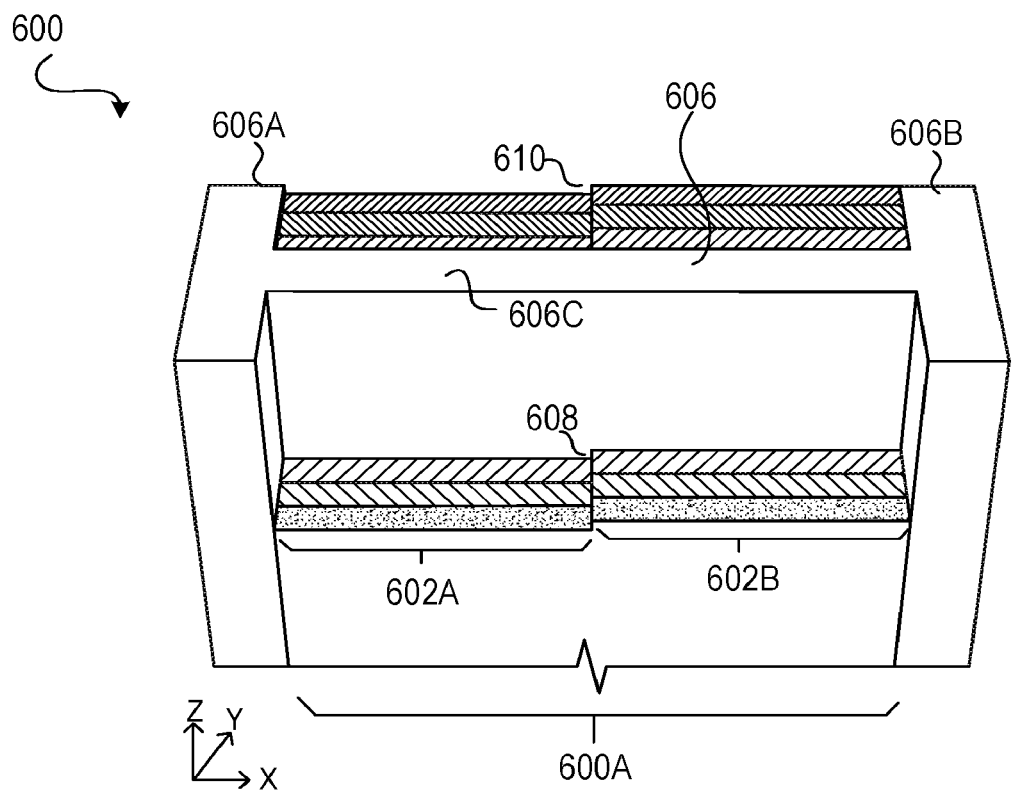
Figure 8B:
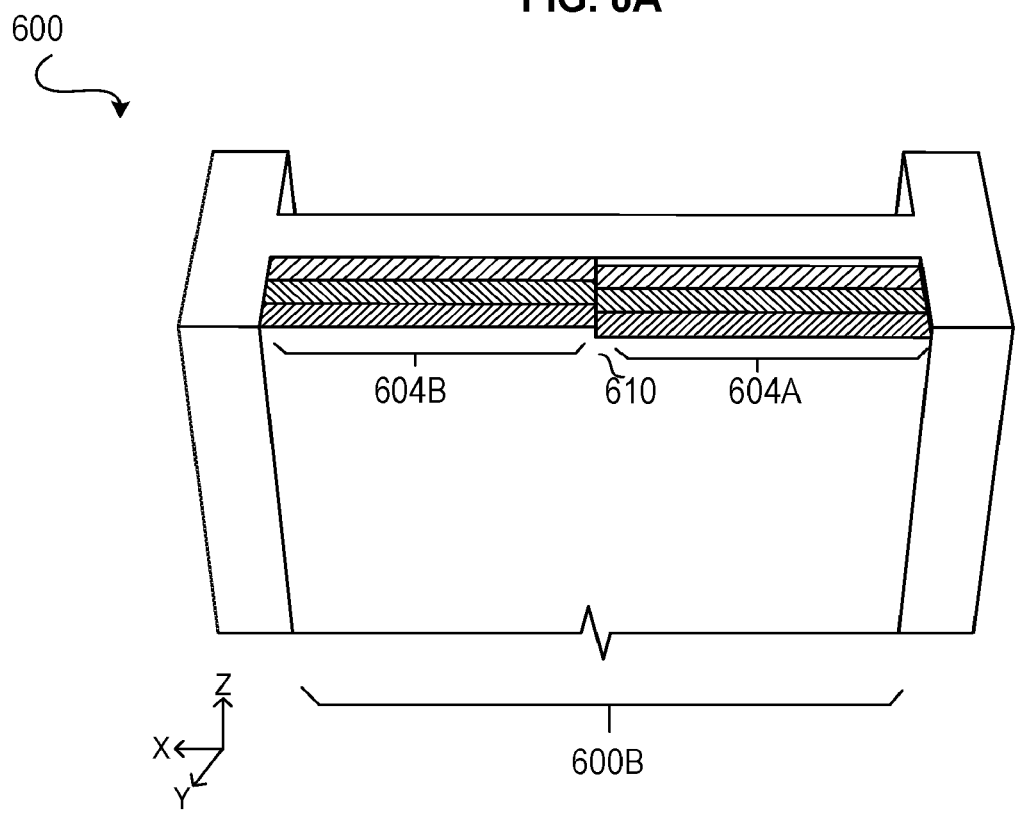

In FIGS. 8A and 8B, a first stair 608 can be formed in the first staircase region 600A and a second stair 610 can be formed in a second staircase region 600B of the stack 600. FIG. 8A is obtained from the front side of the stack and the FIG. 8B is obtained from the backside of the stack. The sacrificial word line layers and insulating layers in the first staircase region 600A can be shaped to form the first stair 608 with a step-down direction along a first lateral direction (e.g., −X direction) parallel to the substrate. The first stair 608 separates the sacrificial word line layers and the insulating layers in the first staircase region 600A into a first section 602A and a second section 602B. In addition, sacrificial word line layers and insulating layers in the second staircase region 600B of the stack 600 can be shaped to form the second stair 610 with a step-down direction along a lateral direction, such as the first lateral direction, where the second stair 610 separates the sacrificial word line layers and the insulating layers in the second staircase region 600B into a third section 604A and a fourth section 604B.

Still referring to FIGS. 8A and 8B, when the first and second staircase regions 600A and 600B are formed, a separation region 606 can be formed as a result in the stack 600. The first and second staircase regions 600A and 600B can be separated by the separation region 606 of the stack 600. The separation region 606 can further include a first portion 606A and a second portion 606B that are positioned at two opposing ends of the separation region 606, and a third portion 606C that is positioned between the first and second portions 606A and 606B. Accordingly, the first staircase region 600A can be arranged between the first and second portions 606A and 606B and extend along the third portion 606C. The second staircase region 600B can be arranged between the first and second portions 606A and 606B and extend along the third portion 606C. The first and second staircase regions 600A and 600B are separated, or spaced apart, from one another by the third portion 606C.

In order to form the first and second stairs 608 and 610, a combination of a photolithography process and an etching process can be applied. The photolithography process can apply a patterned mask layer to expose the first section 602A of the first staircase region 600A and the third section 604A of the second staircase region 600B. The etching process can be applied subsequently to remove portions of one or more of the sacrificial word line layers and the insulating layers in the first section 602A of the first staircase region 600A and in the third section 604A of the second staircase region 600B, respectively. The stairs 608 and 610 can be formed as a result of the completion of the etching process.

Figure 9A:
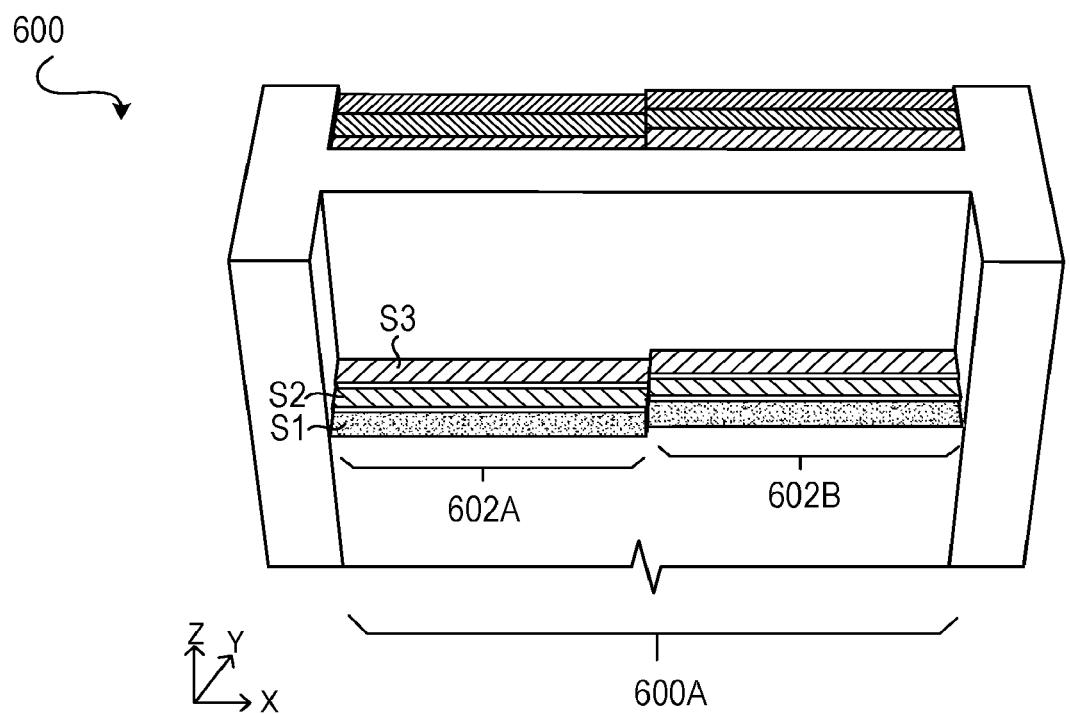
Figure 9B:
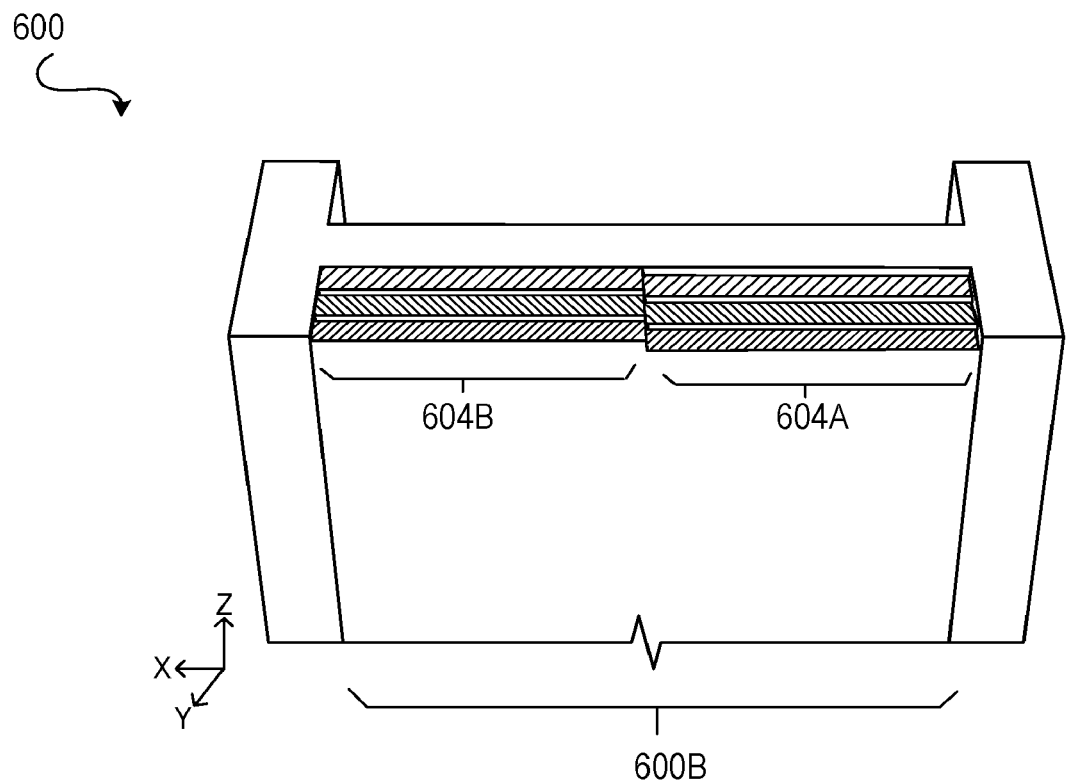

In FIGS. 9A and 9B, one or more of the sacrificial word line layers and the insulating layers in the first staircase region 600A can be shaped to form one or more stairs with a step-down direction along a second lateral direction (−Y direction), where the second lateral direction is perpendicular to the first lateral direction (e.g., −X direction). For example, as shown in FIGS. 9A and 9B, three stairs can be formed in the first and second sections 602A-602B of the first staircase region 600A along the −Y direction. Moreover, one or more of the sacrificial word line layers and the insulating layers in the second staircase region 600B can be shaped to form one or more stairs with a step-down direction along a third lateral direction (Y direction) opposite to the second lateral direction. As shown in FIG. 9B that is obtained from the backside of the stack 600, three stairs can be formed in the third and fourth sections 604A and 604B of the second staircase region 600B along the third lateral direction.

In order to form the one or more stairs along the second or third lateral direction, a resist trim and an etching process can be operated alternately in the first and second staircase regions 600A and 600B respectively. For example, a resist layer can be deposited on the first section 602A of the first staircase region 600A. A photolithography process can introduce a patterned resist layer to expose a first part 51 of the first section 602A along the second lateral direction (e.g., −Y direction). A plasma etching process can be applied to remove portions of one or more of the word line layers and insulating layers in the exposed first part 51. A resist trim process, such as a plasma ashing process, is thus applied to expose a second part S2 of the first section 602A along the second lateral direction, and the plasm etching process can be applied to remove portions of one or more of the word line layers and insulating layers in the exposed second part S2 and exposed first part S1. The plasma ashing process can be subsequently applied again to remove the remaining resist layer. Once the remaining resist layer is removed, three stairs are formed in the first section 602A of the first staircase region 600A along the second lateral direction (−Y direction).

Figure 10A:
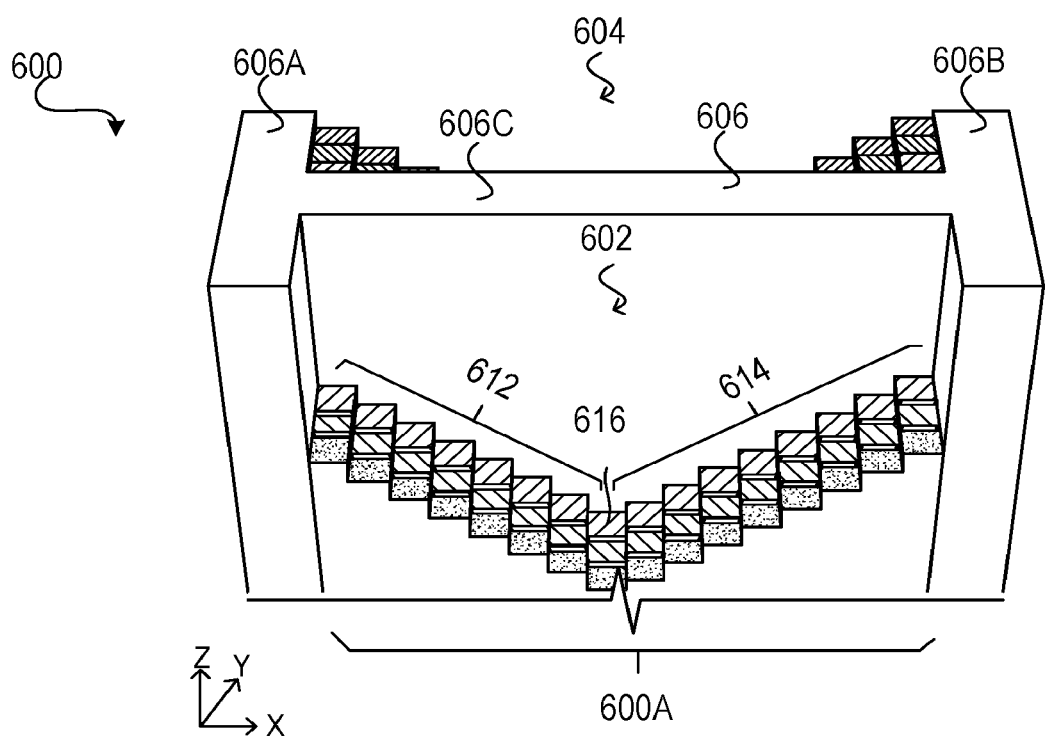
Figure 10B:
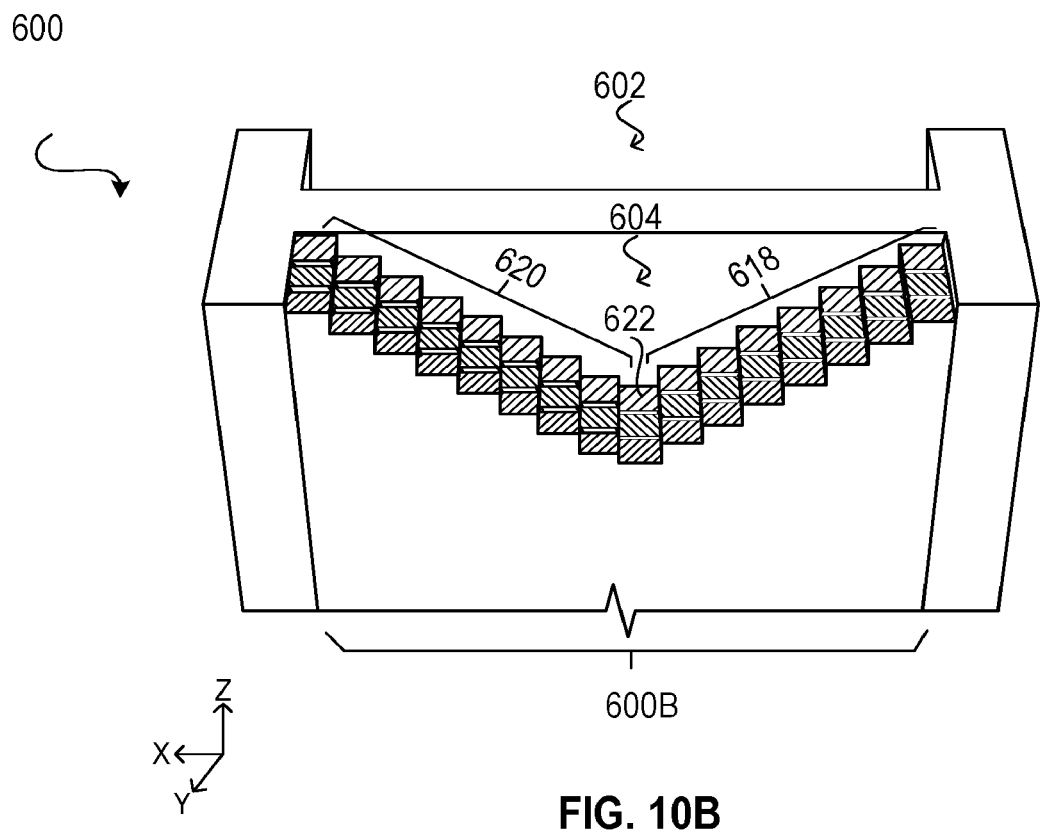

In FIGS. 10A and 10B, a resist trim process and an etching process can be alternately applied on the sacrificial word line layers and the insulating layers in the first and second staircase regions 600A and 600B to form a first staircase 602 and a second staircase 604 in the first staircase region 600A and the second staircase region 600B respectively. FIG. 10A is obtained from the front side of the stack 600 and FIG. 10B is obtained from the backside of the stack 600. As shown in FIGS. 10A and 10B, when the resist trim process and the etching process are completed, the stack 600 can have a similar configuration to the connection region 306 in FIGS. 4A and 4B.

For example, as shown in FIGS. 10A and 10B, the first staircase 602 includes a first group of stairs 612 with a step-down direction along a fourth lateral direction (e.g., X direction) in the first section 602A, and a second group of stairs 614 with a step-down direction along the first lateral (−X direction) direction in the second section 602B. The first group of stairs and the second group of stairs can converge at one or more shared stairs (e.g., stair 616). The second staircase 604 has a third group of stairs 618 with a step-down direction along the fourth lateral direction (X direction) in the third section 604A, and a fourth group of stairs 620 with a step-down direction along the first lateral direction (e.g., −X direction) in the fourth section 604B. The third group of stairs and the fourth group of stairs can converge at one or more shared stairs (e.g., step 622).

In addition, the first staircase 602 can be arranged between the first and second portions 606A and 606B and extend along the third portion 606C of the separation region 606. The second staircase 604 can be arranged between the first and second portions 606A and 606B and extend along the third portion 606C of the separation region 606. The first and second staircases 602 and 604 are separated, or spaced apart, from one another by the third portion 606C of the separation region 606.

Figure 11:
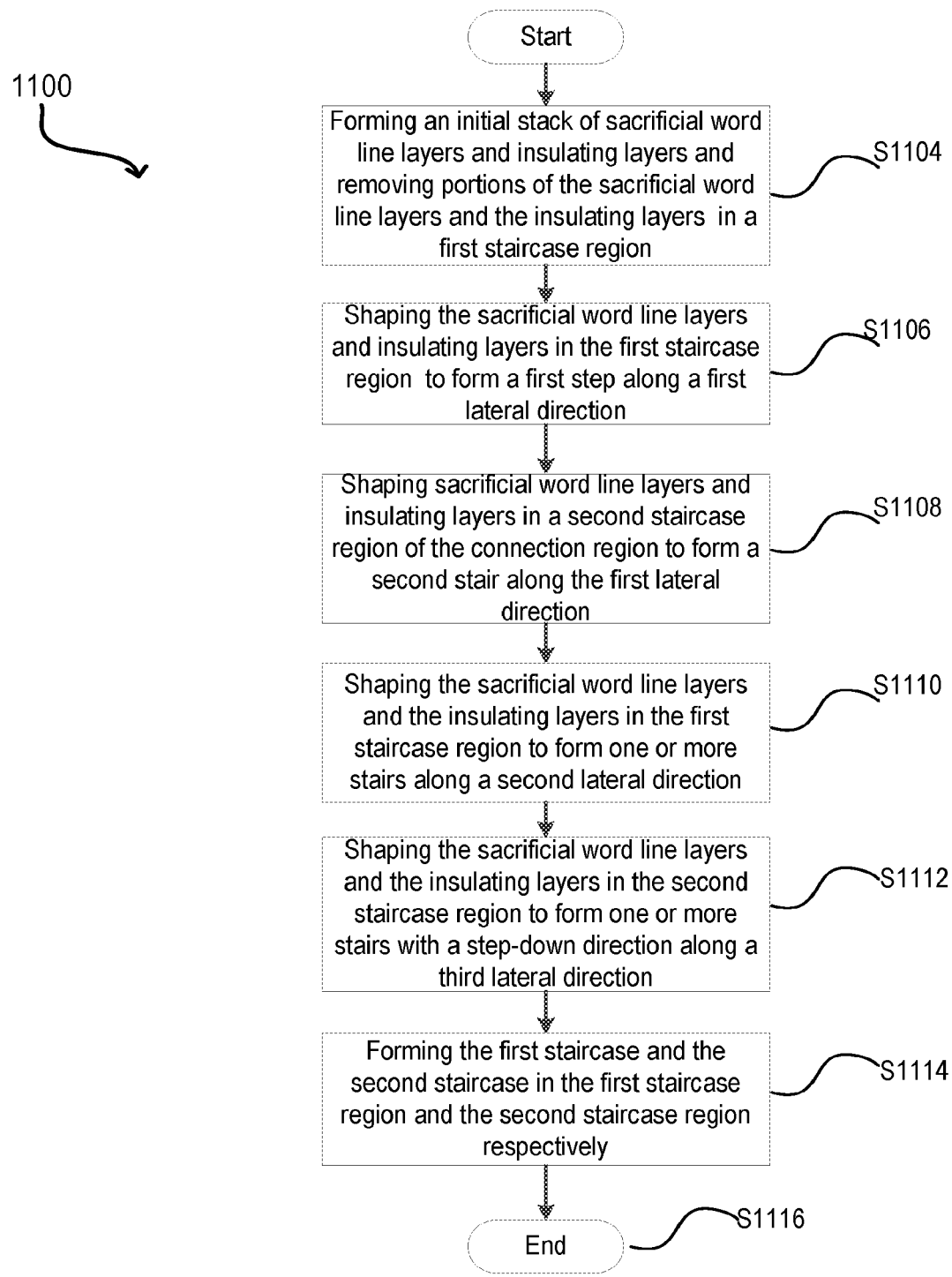
FIG. 11 is a flowchart of a process for manufacturing an exemplary 3D NAND device, in accordance with exemplary embodiments of the disclosure.

FIG. 11 is a flowchart of a process 1100 for manufacturing the disclosed 3D NAND device in accordance with some embodiments of the present disclosure. The process 1100 begins at step S1104 where an initial stack of sacrificial word line layers and insulating layers can be formed over a substrate of the 3D NAND device. Subsequently, portions of one or more of the sacrificial word line layers and the insulating layers can be removed along a vertical direction in a first staircase region of a connection region of the initial stack. The connection region is positioned between array regions (e.g., two array regions) of the initial stack. The connection region is, for example, disposed at two opposing sides of the initial stack. In some embodiments, step S1104 can be performed as illustrated with reference to FIGS. 6A, 6B, 7A, and 7B.

The process 1100 then proceeds to step S1106 where one or more of the sacrificial word line layers and the insulating layers in the first staircase region can be shaped, or removed, to form a first stair with a step-down direction along a first lateral direction (e.g., −X direction). The first stair separates the sacrificial word line layers and the insulating layers in the first staircase region into a first section and a second section. In step S1108 of the process 1100, one or more sacrificial word line layers and insulating layers can be shaped, or removed, in a second staircase region of the connection region to form a second stair with a step-down direction along a lateral direction, such as the first lateral direction. The second stair separates the sacrificial word line layers and the insulating layers in the second staircase region into a third section and a fourth section. The first and second staircase regions can further be separated by a separation region of the connection region. In some embodiments, the steps S1106 and S1108 can be performed as illustrated with reference to FIGS. 8A and 8B. In some embodiments, the step S1106 can be performed before the step S1108. In some embodiments, the step S1108 can be performed before the step S1106. In some embodiments, the step S1106 and the step S1108 can be operated concurrently depending on the manufacturing flow. A benefit from performing steps S1106 and S1108 concurrently is that manufacturing time can be reduced.

In step S1110 of the process 1100, one or more of the sacrificial word line layers and the insulating layers in the first staircase region can be shaped to form one or more stairs with a step-down direction along a second lateral direction (e.g., −Y direction). The second lateral direction is, for example, perpendicular to the first lateral direction (e.g., −X direction). In step S1112 of the process 1100, one or more of the sacrificial word line layers and the insulating layers in the second staircase region can be shaped to form one or more stairs with a step-down direction along a third lateral direction (e.g., Y direction). The third lateral direction is, for example, opposite to the second lateral direction. In some embodiments, the steps S1110 and S1112 can be performed as illustrated with reference to FIGS. 9A and 9B. In some embodiments, the step S1110 can be performed before the step S1112. In some embodiments, the step S1112 can be performed before the step S1110. In some embodiments, the step S1110 and the step S1112 can be operated concurrently depending on the manufacturing flow. A benefit from performing steps S1110 and S1112 concurrently is that manufacturing time can be reduced.

The process 1100 then proceeds to step S1114 where a resist trim process and an etching process can be operated alternately on the sacrificial word line layers and the insulating layers in the first and second staircase regions to form the first staircase and the second staircase in the first staircase region and the second staircase region respectively. In some embodiments, the step S1114 can be performed as illustrated with reference to FIGS. 10A-10B.

It should be noted that additional steps can be provided before, during, and after the process 1100, and some of the steps described can be replaced, eliminated, or performed in a different order in other embodiments of the process 1100. For example, in subsequent process steps, channel structures can be formed in the array regions of the initial stack. The channel structures can extend from the substrate and extend through the sacrificial word line layers and the insulating layers in the array regions of the initial stack. The sacrificial word line layers then can be replaced with a conductive material to form word line layers. Further, first contact structures can be formed on the first staircase, and second contact structures can be formed on the second staircase. The first contact structures can be connected to the word line layers in the first staircase, and the second contact structures can be connected to the word line layers in the second staircase.

Moreover, various additional interconnect structures (e.g., metallization layers having conductive lines and/or vias) may be formed over the 3D NAND device. Such interconnect structures electrically connect the 3D NAND device with other contact structures and/or active devices to form functional circuits. Additional device features such as passivation layers, input/output structures, and the like may also be formed.

The various embodiments described herein offer several advantages over related memory devices. For example, in the disclosed 3D NAND device, a connection region is arranged between array regions of the 3D NAND device, where the array regions can be formed at two opposing sides of the 3D NAND device. The disclosed connection region can have one or more staircases. The one or more staircases can further have two or more step-down directions. The disclosed connection region can not only enhance word line controls but also simplify a manufacturing process and minimize a mask request by combining a chop process and a stair divided scheme during the manufacturing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a stack of word line layers and insulating layers that are stacked alternatingly over the substrate; and
channel structures formed in a first array region and a second array region of the stack, the first array region and the second array region being positioned at opposing sides of the stack, wherein
a first staircase is formed in a connection region of the stack over the substrate, the connection region being arranged between the first array region and the second array region,
a second staircase is formed in the connection region of the stack over the substrate,
the connection region in the stack includes a separation region between the first staircase and the second staircase, and
each stair in the first staircase has a first height value that is smaller than a second height value of a corresponding stair in the second staircase on an opposite side of the separation region, the first height value being equal to a distance from the substrate to a top surface of the respective stair in the first staircase, the second height value being equal to a distance from the substrate to a top surface of the corresponding stair in the second staircase.

2. The semiconductor device of claim 1, wherein
the first staircase has first stairs with a first step-down direction, and second stairs with a second step-down direction, the first step-down direction being opposite to the second step-down direction, and
the first stairs and the second stairs converge at a first shared stair.

3. The semiconductor device of claim 2, wherein the first stairs and the second stairs further have a third step-down direction.

4. The semiconductor device of claim 3, wherein
the second staircase has third stairs with the first step-down direction, and fourth stairs with the second step-down direction, and
the third stairs and the fourth stairs converge at a second shared stair.

5. The semiconductor device of claim 4, wherein the third stairs and the fourth stairs further have a fourth step-down direction that is opposite to the third step-down direction.

6. The semiconductor device of claim 1, wherein the separation region further comprises a first portion and a second portion that are positioned at opposing ends of the separation region, and a third portion that is positioned between the first and second portions, wherein:
the first staircase is arranged between the first and second portions and extends along the third portion;
the second staircase is arranged between the first and second portions and extends along the third portion; and
the first staircase and the second staircase are spaced apart from one another by the third portion.

7. The semiconductor device of claim 6, wherein the first portion and the second portion of the separation region are of a same width, and the third portion has a smaller width than the first and second portions.

8. The semiconductor device of claim 1, wherein an uppermost stair in the second staircase and the separation region are of a same height.

9. The semiconductor device of claim 1, further comprising:
first contact structures formed on the first staircase and connected to the word line layers in the first staircase; and
second contact structures formed on the second staircase and connected to the word line layers in the second staircase.

10. The semiconductor device of claim 1, wherein a height of an uppermost stair in the first staircase is a half of a height of an uppermost stair in the second staircase.

* * * * *